US012342478B2

(12) United States Patent
Wenk et al.

(10) Patent No.: US 12,342,478 B2
(45) Date of Patent: Jun. 24, 2025

(54) COMPACT CONTROL MODULE FOR A VEHICLE WITH AT LEAST ONE ELECTRIC MOTOR AND A TRANSMISSION

(71) Applicant: Vitesco Technologies Germany GmbH, Hannover (DE)

(72) Inventors: Alexander Wenk, Burgoberbach (DE); Peter Schroll, Nuremberg (DE); Karl Maron, Heroldsberg (DE); Yvonne Wiegand, Mainstockheim (DE)

(73) Assignee: Vitesco Technologies Germany GmbH, Regensburg (DE)

( * ) Notice: Subject to any disclaimer, the term of this patent is extended or adjusted under 35 U.S.C. 154(b) by 276 days.

(21) Appl. No.: 18/191,238

(22) Filed: Mar. 28, 2023

(65) Prior Publication Data

US 2023/0300997 A1    Sep. 21, 2023

Related U.S. Application Data

(63) Continuation of application No. PCT/EP2021/077735, filed on Oct. 7, 2021.

(30) Foreign Application Priority Data

Oct. 9, 2020    (DE) .................. 10 2020 212 811.1

(51) Int. Cl.
  *H05K 5/00*    (2025.01)
  *H05K 7/20*    (2006.01)

(52) U.S. Cl.
  CPC ....... *H05K 5/0082* (2013.01); *H05K 7/20254* (2013.01)

(58) Field of Classification Search
  CPC ..... H05K 2201/066; H05K 2201/0715; H05K 5/0043; H05K 5/0034; H05K 5/0082;
  (Continued)

(56) References Cited

U.S. PATENT DOCUMENTS

| | | | |
|---|---|---|---|
| 7,696,532 B2 * | 4/2010 | Knapp | H01L 23/051 257/718 |
| 2004/0164703 A1 | 8/2004 | Berels | |

(Continued)

FOREIGN PATENT DOCUMENTS

| | | |
|---|---|---|
| CN | 1896475 A | 1/2007 |
| CN | 100413243 C | 8/2008 |

(Continued)

OTHER PUBLICATIONS

International Search Report and Written Opinion dated Jan. 13, 2022 from corresponding International Patent Application No. PCT/EP2021/077735.

(Continued)

*Primary Examiner* — Michael A Matey

(57) ABSTRACT

A control module for a vehicle with at least one electric motor and a transmission is provided. The control module has a housing for accommodating a transmission control electronics, a converter electronics for controlling an electric motor, and a cooling body. The housing includes a housing upper part and a housing lower part. The cooling body is arranged between the housing upper part and the housing lower part in such a way that the cooling body forms a part of the housing, that the housing lower part and the cooling body form a media-tight first cavity for accommodating the converter electronics. The converter electronics is thermally conductively connected to the cooling body, and the housing upper part and the cooling body form a media-tight second cavity for accommodating the transmission control electronics. The transmission control electronics is thermally conductively connected to the cooling body.

6 Claims, 2 Drawing Sheets

(58) Field of Classification Search
CPC .. H05K 7/20254; H05K 3/284; H05K 5/0056; H05K 7/1432; H05K 7/14322; H01L 23/3121; H01L 23/36; H01L 23/4334; B60L 15/20; B60L 3/0046; B60L 50/61; B60L 58/26; Y02T 10/62; Y02T 10/70; B60K 2001/003; B60R 16/0238; B60R 16/03; H01M 10/425; H01M 10/4257; H01M 10/482; H01M 10/6551; H01M 2010/4271; H01M 2010/4278; H01M 2220/20; H01M 50/20; H01M 50/50; H01M 50/572; H01M 50/583; H02G 3/03; Y02E 60/10

See application file for complete search history.

(56) References Cited

U.S. PATENT DOCUMENTS

| | | | |
|---|---|---|---|
| 2004/0246678 A1* | 12/2004 | Lin | H01L 23/467 |
| | | | 257/E23.099 |
| 2008/0287255 A1 | 11/2008 | Snyder | |
| 2009/0251831 A1 | 10/2009 | Shiba | |
| 2010/0188813 A1* | 7/2010 | Nakatsu | B60L 15/20 |
| | | | 361/689 |
| 2012/0240396 A1* | 9/2012 | Becker | H05K 5/0082 |
| | | | 29/841 |
| 2013/0077255 A1* | 3/2013 | Abe | H05K 7/209 |
| | | | 361/716 |
| 2013/0301328 A1* | 11/2013 | Ito | B60L 3/003 |
| | | | 363/141 |
| 2014/0132379 A1 | 5/2014 | Kozarekar | |
| 2014/0132382 A1 | 5/2014 | Zarei | |
| 2014/0175867 A1 | 6/2014 | Vafakhah | |
| 2015/0072206 A1* | 3/2015 | Houchin-Miller | |
| | | | H01M 10/482 |
| | | | 429/151 |
| 2015/0210158 A1* | 7/2015 | Brindak | B60K 11/06 |
| | | | 174/547 |
| 2016/0303995 A1 | 10/2016 | Lei | |
| 2016/0309623 A1 | 10/2016 | Lei | |
| 2016/0361975 A1 | 12/2016 | Blatchley | |
| 2017/0072934 A1 | 3/2017 | Onouchi | |
| 2018/0097266 A1 | 4/2018 | Jalilevand | |
| 2020/0022284 A1* | 1/2020 | Kita | H02G 3/03 |

FOREIGN PATENT DOCUMENTS

| | | |
|---|---|---|
| CN | 107781411 A | 3/2018 |
| DE | 102004008817 A | 10/2004 |
| DE | 102008022984 A1 | 12/2008 |
| DE | 112007001594 T5 | 5/2009 |
| DE | 102013222587 A1 | 5/2014 |
| DE | 102013222595 A1 | 5/2014 |
| DE | 102013222599 A1 | 5/2014 |
| DE | 112015000464 T5 | 9/2016 |
| DE | 102016106878 A1 | 10/2016 |
| DE | 102016106879 A1 | 10/2016 |
| DE | 102016109599 A1 | 12/2016 |
| DE | 102017122818 A1 | 4/2018 |
| EP | 3284977 B1 | 10/1988 |
| EP | 2899082 B1 | 1/2021 |
| JP | 2011189799 A | 9/2011 |
| JP | 5292342 B2 | 9/2013 |
| JP | 5372817 B2 | 12/2013 |
| JP | 5417225 B2 | 2/2014 |
| JP | 5724658 B2 | 5/2015 |

OTHER PUBLICATIONS

German Office Action dated May 10, 2022 for corresponding German Patent Application No. 10 2020 212 811.1.

* cited by examiner

COMPACT CONTROL MODULE FOR A VEHICLE WITH AT LEAST ONE ELECTRIC MOTOR AND A TRANSMISSION

CROSS-REFERENCE TO RELATED APPLICATIONS

This application claims the benefit of International Application PCT/EP2021/077735, filed Oct. 7, 2021, which claims priority to German Application 10 2020 212 811.1, filed Oct. 9, 2020. The disclosures of the above applications are incorporated herein by reference.

TECHNICAL FIELD

The disclosure relates to a control module for a vehicle with at least one electric motor and a transmission.

BACKGROUND

Electromobility means, in particular, the use of electric cars. These are driven fully or partially electrically, have an onboard energy store, and receive their energy predominantly from the power network.

Hybrid vehicles combine two drive technologies. Shorter distances can generally be covered electrically but they can also manage long distances using their internal combustion engine. Hybrid cars which can also be charged at an electric outlet are referred to as plug-in hybrids. Hybrid vehicles are considered a bridging technology until cars are driven completely by electricity.

The vehicles are generally provided with a transmission which is designed to transmit torque between an input and an output of the transmission by way of torque transmission clutches.

Operation of the transmission is controlled by a transmission control unit.

A further central component of the electric drive train in hybrid and electric vehicles are the power electronics. They are responsible, in particular, for activating the electric machine, communicating with the vehicle control system, and diagnosing the drive.

The power electronics generally include an electronic control unit, an inverter, and a DC-to-DC converter. The control unit represents the switching center of the power electronics. DC-to-AC converters or inverters convert the direct current of the battery into alternating current for the drive of the electric motor. The electric motor finally converts electrical energy into mechanical energy. This process is reversed in order to charge the battery.

The AC-to-AC converter is part of the further central components of an electric-powered vehicle. It converts the high battery voltage, of 100-400 volts or more, into the much lower operating voltage, of 12 or 48 volts, for electronic components.

DE 10 2013 222 599 A1 describes a vehicle with an internal combustion engine and an electric motor, where a transmission control module also controls the electric motor, the inverter, and the DC-to-DC converter in addition to the transmission.

SUMMARY

The disclosure provides a compact control module for a vehicle with at least one electric motor and a transmission, as a result of which the number of the individual parts of the control module can be minimized and where it is possible for expensive, relatively low-loss structural elements to be dispensed with by virtue of the efficient removal of the heat generated by the electronics.

The control module includes a housing that has a housing upper part and a housing lower part. A cooling body is arranged between the housing upper part and the housing lower part in such a way that the cooling body forms a part of the housing.

The housing lower part and the cooling body form a media-tight first cavity for accommodating the converter electronics. The converter electronics is thermally conductively connected to the cooling body.

The housing upper part and the cooling body form a media-tight second cavity for accommodating the transmission control electronics.

The transmission control electronics is thermally conductively connected to the cooling body such that the transport of heat takes place from the transmission control electronics directly to the cooling body.

A compact control module for an inverter and a transmission with a common efficient cooling device is consequently provided which can be used in a vehicle both as an attached-to and standalone control module.

In some implementations, the thermally conductive connection between the converter electronics and the cooling body, and the thermally conductive connection between the transmission control electronics and the cooling body is provided by way of a heat-conductive material.

Depending on the quantity of heat to be dissipated and depending on the size of the contact area of the parts involved in the heat transmission, standard silicone-based heat-conductive pastes or high-performance heat-conductive pastes with improved thermal conductivity or heat-conductive adhesives may be used.

In some examples, the housing upper part has latching tabs and the cooling body has latching lugs, where a latching tab of the housing upper part is operatively connected to a corresponding latching lug of the cooling body in order to form the housing.

In some examples, the cooling channels of the cooling body are sealed on the side opposite the converter electronics by a separate cover.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
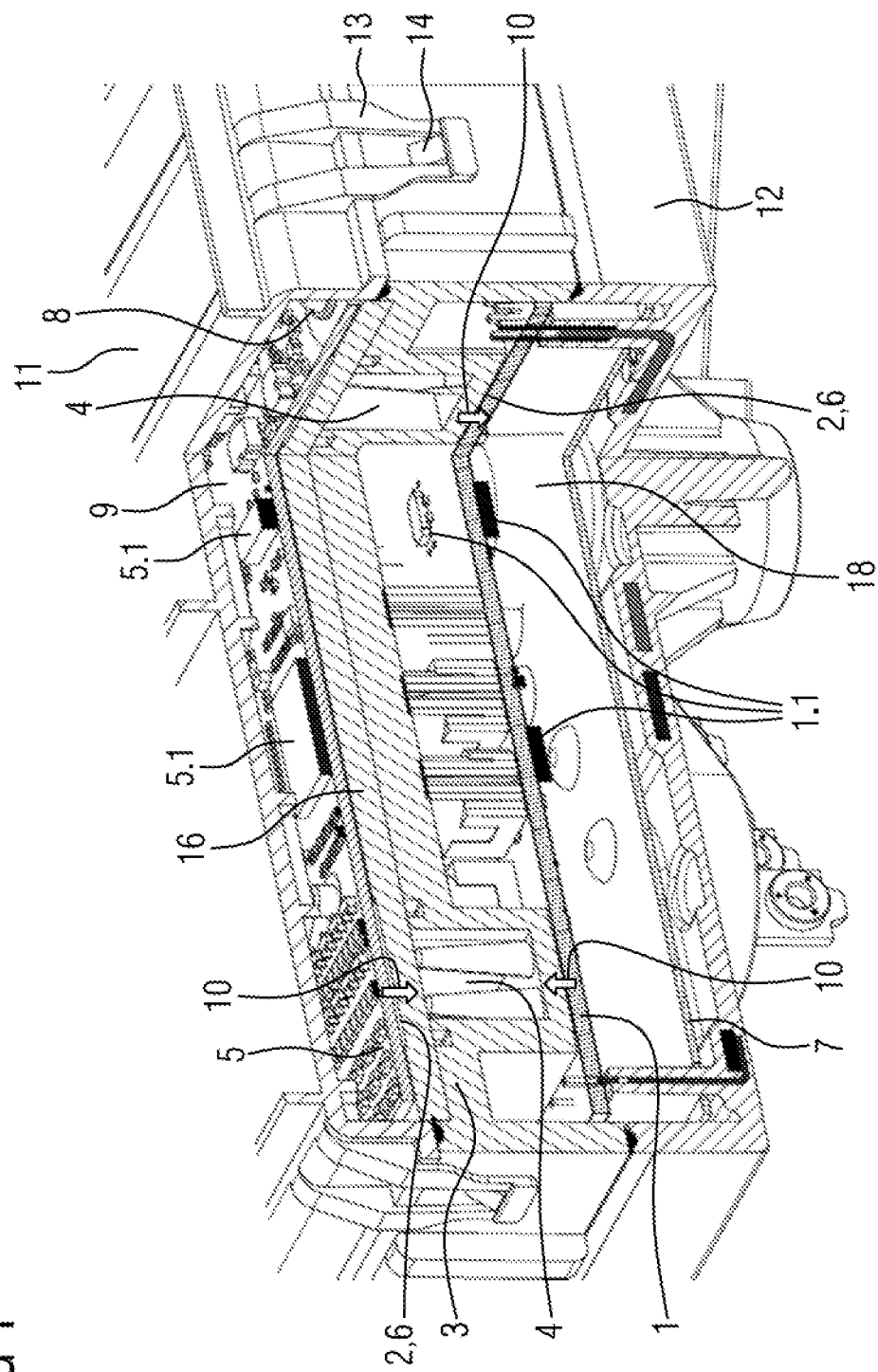
FIG. 1 shows a perspective view of an exemplary control module.

FIG. 1 shows a control module for a vehicle which has at least one electric motor and a transmission, for example an electric car or a hybrid vehicle. The control module has a housing 11, 12 for accommodating transmission a controller 5 for controlling the transmission, and for accommodating converter electronics 1 for controlling an electric motor. The control module additionally has a cooling body 3 to remove, via a coolant, the heat generated by the electronics.

The housing 11, 12 includes a housing upper part 11 and a housing lower part 12.

The cooling body 3 is arranged between the housing upper part 11 and the housing lower part 12 such that the cooling body 3 forms a part of the housing 3, 11, 12.

The housing lower part 12 and the cooling body 3 form a media-tight first cavity 9 for accommodating the converter electronics 1. The converter electronics 1 include a printed circuit board and electronic structural components 1.1. The electronic structural components 1.1 are attached here both to the underside of the printed circuit board of the converter electronics 1, facing towards the cooling body 3, in a corresponding recess, and to the upper side of the printed circuit board. The printed circuit board of the converter electronics 1 is thus populated here on both sides. A heat-conductive material 2, 6 between the cooling body 3 and the converter electronics 1 ensures good heat transport 10 from the converter electronics 1 to the cooling body 3. With use of a heat-conductive adhesive 2, 6, an extra mechanical connection between the converter electronics 1 and the cooling body 3 can be omitted.

The cooling liquid channels 4 of the cooling body 3 are sealed here in FIG. 1 on the side opposite the converter electronics 1 by a separate cover 16 made of thermally conductive material.

The housing upper part 11 is arranged on the side of the cooling body 3 opposite the converter electronics 1 in such a way that the cooling body 3 and the housing upper part 11 form a media-tight second cavity 18 for accommodating the transmission control electronics 5.

The transmission control electronics 5, which includes a printed circuit board with electronic structural elements 5.1, is connected here to the cover 16 of the cooling body 3 both thermally conductively and also mechanically by way of a heat-conductive material 2, 6. The transmission control electronics 5 is additionally screwed to the cover 16 by the screw 8. A heat-conductive paste instead of a heat-conductive adhesive can then be used as heat-conductive material 2, 6. The heat transport 10 from the transmission control electronics 5 to the cover 16 can be increased further by the use of a high-performance heat-conductive material 6.

The housing lower part 12 is fastened to the side of the cooling body 3 opposite the housing upper part 11 in a frictionally engaged manner, for example by way of a screw, or in an integrally bonded manner by way of welding or gluing and in particular forms the interface of the control module, here in the form of an attached-to design, to a transmission (not shown). The control module, however, could also be installed in the vehicle in the form of a stand-alone design, separated from the transmission.

A shield 7 is arranged between the converter electronics 1 and the housing lower part 12. This shield 7 serves, in particular, to reduce or to avoid a harmful electromagnetic radiation, primarily emanating from the converter electronics 1, to the surroundings of the control module.

The housing upper part 11 has latching tabs 13 and the cooling body 3 has corresponding latching lugs 14. A latching tab 13 of the housing upper part 11 is operatively connected to a corresponding latching lug 14 of the cooling body 3. A latching lug 14, having the same effect, could also be arranged on the housing lower part 12.

Figure 2:
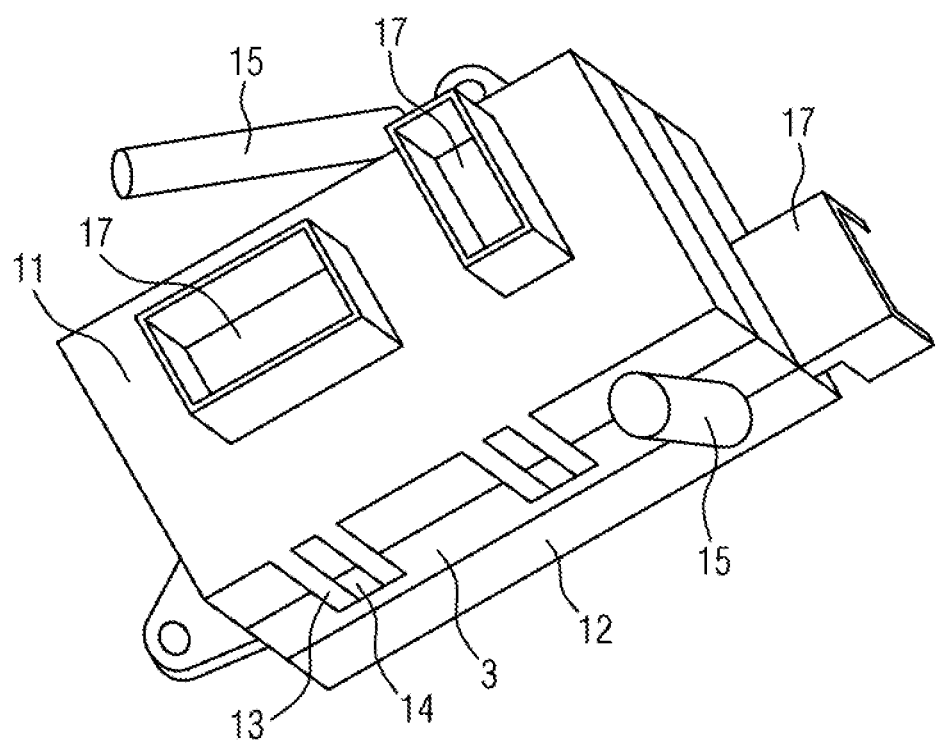
FIG. 2 shows a view of a further exemplary control module.

FIG. 2 shows a perspective view of a control module. The connections 17, in particular for exchanging signals and supply voltages with the surroundings electronics (not shown), for the converter electronics 1 and the transmission control electronics 5 are arranged on the upper side of the housing upper part 11, but could also be located laterally on the housing upper part 11, or on the upper side of the housing lower part 12 or laterally on the housing lower part 12. A combination of both arrangements would also be conceivable.

Latching tabs 13 and latching lugs 14 and also both cooling connections 15 of the cooling body 3 are also shown in FIG. 2.

This compact control unit for an inverter and a transmission with a common efficient cooling device can be used in a vehicle both as an attached-to and standalone control unit.

A number of implementations have been described. Nevertheless, it will be understood that various modifications may be made without departing from the spirit and scope of the disclosure. Accordingly, other implementations are within the scope of the following claims.

What is claimed is:

1. A control module for a vehicle having at least one electric motor and a transmission, the control module comprises:
a housing for accommodating a transmission control electronics, a converter electronics for controlling an electric motor, and a cooling body, the housing includes:
a housing upper part, and
a housing lower part, the cooling body is arranged between the housing upper part and the housing lower part in such a way that the cooling body forms a part of the housing;
a media-tight first cavity is formed by the housing lower part and the cooling body for accommodating the converter electronics, the converter electronics is thermally conductively connected to the cooling body; and
a media-tight second cavity is formed by the housing upper part and the cooling body for accommodating the transmission control electronics, the transmission control electronics is thermally conductively connected to the cooling body.

2. The control module of claim 1, wherein the thermally conductive connection between the converter electronics and the cooling body and the thermally conductive connection between the transmission control electronics and the cooling body is provided by a heat-conductive material.

3. The control module of claim 2, wherein the heat-conductive material is a heat-conductive paste or a heat-conductive adhesive.

4. The control module of claim 1, wherein the housing upper part includes latching tabs and the cooling body has latching lugs, wherein a latching tab of the housing upper part is operatively connected to a corresponding latching lug of the cooling body to form the housing.

5. The control module of claim 1, wherein the cooling channels of the cooling body is sealed on a side opposite the converter electronics by a separate cover.

6. The control module of claim 5, wherein a cooling liquid being water or oil flows through the cooling channels.

* * * * *